(12) United States Patent
Wong Han Boon et al.

(10) Patent No.: US 6,209,295 B1
(45) Date of Patent: Apr. 3, 2001

(54) PLASTIC AND METAL TUBE HOLDER FOR SOIC PACKAGE

(75) Inventors: Thomas Wong Han Boon; Hasan Bin Odek; Peter Heng Yiak Khian, all of Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/298,447

(22) Filed: Apr. 23, 1999

(51) Int. Cl.[7] ............................... B65B 5/10; B65B 39/08
(52) U.S. Cl. .................................. 53/506; 53/255
(58) Field of Search ..................... 53/202, 235, 255, 53/258, 390, 506

(56) References Cited

U.S. PATENT DOCUMENTS

| | | | |
|---|---|---|---|
| 1,709,189 | * | 4/1929 | Radtke ................................... 53/506 |
| 4,686,816 | * | 8/1987 | Keller . |
| 5,209,047 | * | 5/1993 | Olson ..................................... 53/255 |
| 5,381,641 | * | 1/1995 | Boja et al. ............................. 53/255 |

* cited by examiner

*Primary Examiner*—I Cuda Rosenbaum
*Assistant Examiner*—Eric Compton
(74) *Attorney, Agent, or Firm*—Davis Chin

(57) ABSTRACT

A tube holder assembly is provided for use with an output track assembly of an IC test handler so as to eliminate the need of transferring tested SOIC packages loaded in plastic tubes to metal tubes for a "burn-in" process. The tube holder assembly is comprised of an output tube guide member, a tube holder member, a tube holder guide member, and a holder screw. The tube holder member is vertically slidable relative to the tube holder guide member between a lower position and an upper position. The tube holder member is pushed downwardly into the lower position so as to load directly SOIC packages into plastic tubes and is raised to the upper position so as to load directly the SOIC packages into metal tubes.

18 Claims, 5 Drawing Sheets

PLASTIC AND METAL TUBE HOLDER FOR SOIC PACKAGE

These test handlers are presently being used to handle SOIC packages for IC testing. In typical operating conditions of these prior art test handlers, the SOIC packages after being tested are automatically sorted and loaded into the desired output track of the test handler dependent upon the outcome of the test performed. When an output track has reached its loading capacity, the SOIC packages in the particular one of the output tracks are required to be manually loaded by an operator into empty plastic tubes. This loading procedure is then repeated for all of the other remaining output tracks until all of the SOIC packages have been loaded for further transportation and/or testing.

In certain circumstances, the tested SOIC packages that have been loaded into the plastic tubes are ready to be transferred to another location for further manufacturing operations or for shipment directly to a customer's site. In other circumstances, these tested SOIC packages that have been tested as "good" and already loaded into the plastic tubes are required to undergo a "burn-in" procedure. This "burn-in" procedure subjects the SOIC packages to relatively high temperatures in an oven for a long duration. In view of this, the plastic tubes that were already loaded with the tested SOIC packages are unsuitable for use during the "burn-in" process. This is due to the fact that the plastic tubes in the "burn-in" environment would be deformed when they are subjected to the high temperatures.

Therefore, there has arisen a need for utilizing metal tubes instead of the plastic tubes. However, this somewhat time-consuming and difficult additional process of transferring manually the tested SOIC packages from the plastic tubes to the metal tubes prior to performing the "burn-in" process suffers from several disadvantages. Due to the large volume of tubes that are assembled during shipping (i.e., more than 100 tubes), this extra step of transferring the SOIC packages creates the problem of requiring more assembly time. Further, there is the drawback of added labor costs for the production operation since there is needed additional manpower for performing the manual transfer process.

Thus, there has arisen a need of providing a means for use with the output track assembly of an IC test handler so as to eliminate the step of transferring tested SOIC packages loaded in the plastic tubes to metal tubes for a "burn-in" process. This is achieved in the present invention by the provision of a tube holder assembly which is operatively connected to an output track assembly of an IC test handler so as to directly transfer SOIC packages therefrom into either plastic tubes or metal tubes.

SUMMARY OF THE INVENTION

Accordingly, it is a general object of the present invention to provide a tube holder assembly for use with an output track assembly of an IC test handler which is relatively simple and economical to manufacture and assemble, but yet overcomes the disadvantages of the prior art test handlers.

It is an object of the present invention to provide a tube handler assembly which eliminates the process of manually transferring of SOIC packages from plastic tubes to metal tubes.

It is another object of the present invention to provide a tube holder assembly which accommodates both plastic tubes and metal tubes so as to reduce the time-consuming process of loading the same and thus saving labor costs.

It is still another object of the present invention to provide a tube holder assembly for directly transferring SOIC packages into either plastic tubes or metal tubes which is comprised of an output tube guide member, a tube holder member, a tube holder guide member, and a holder screw.

In a preferred embodiment of the present invention, there is provided a tube holder assembly for use with an output track assembly of an IC test handler so as to eliminate the process of manually transferring of SOIC packages from plastic tubes to metal tubes. The tube holder assembly includes an output tube guide member operatively connected to the output track assembly of the IC test handler. The output tube guide member has a plurality of output tracks and is adapted to receive ones of plastic tubes and metal tubes. A tube holder guide member is operatively connected to the output tube guide member to support the tube holder member. The tube holder member is vertically slidable relative to the tube holder guide member between a lower position and an upper position.

The tube holder member is pushed downwardly into the lower position so as to load directly the SOIC packages into the plastic tubes and is raised to the upper position so as to load directly the SOIC packages into the metal tubes. There is provided screw means for releasably securing the tube holder member in the lower position so as to hold the tube holder member in a position with the plurality of output tracks of the output tube guide member when the SOIC packages are being loaded into the plastic tubes.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
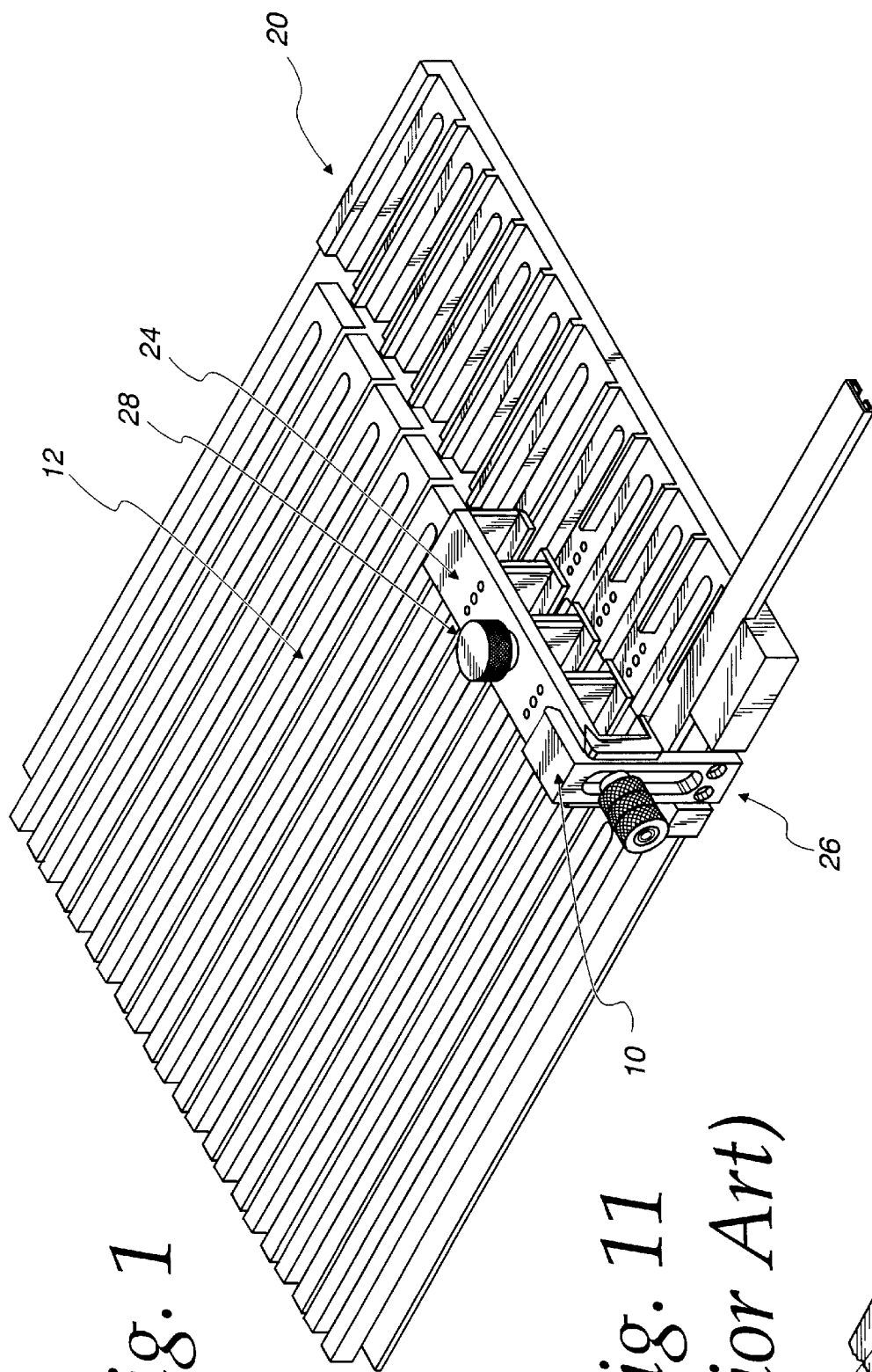
FIG. 1 is a perspective view of a tube holder assembly, which is constructed in accordance with the principles of the present invention and is adapted for use with an output track assembly of a test handler.
Figure 2:
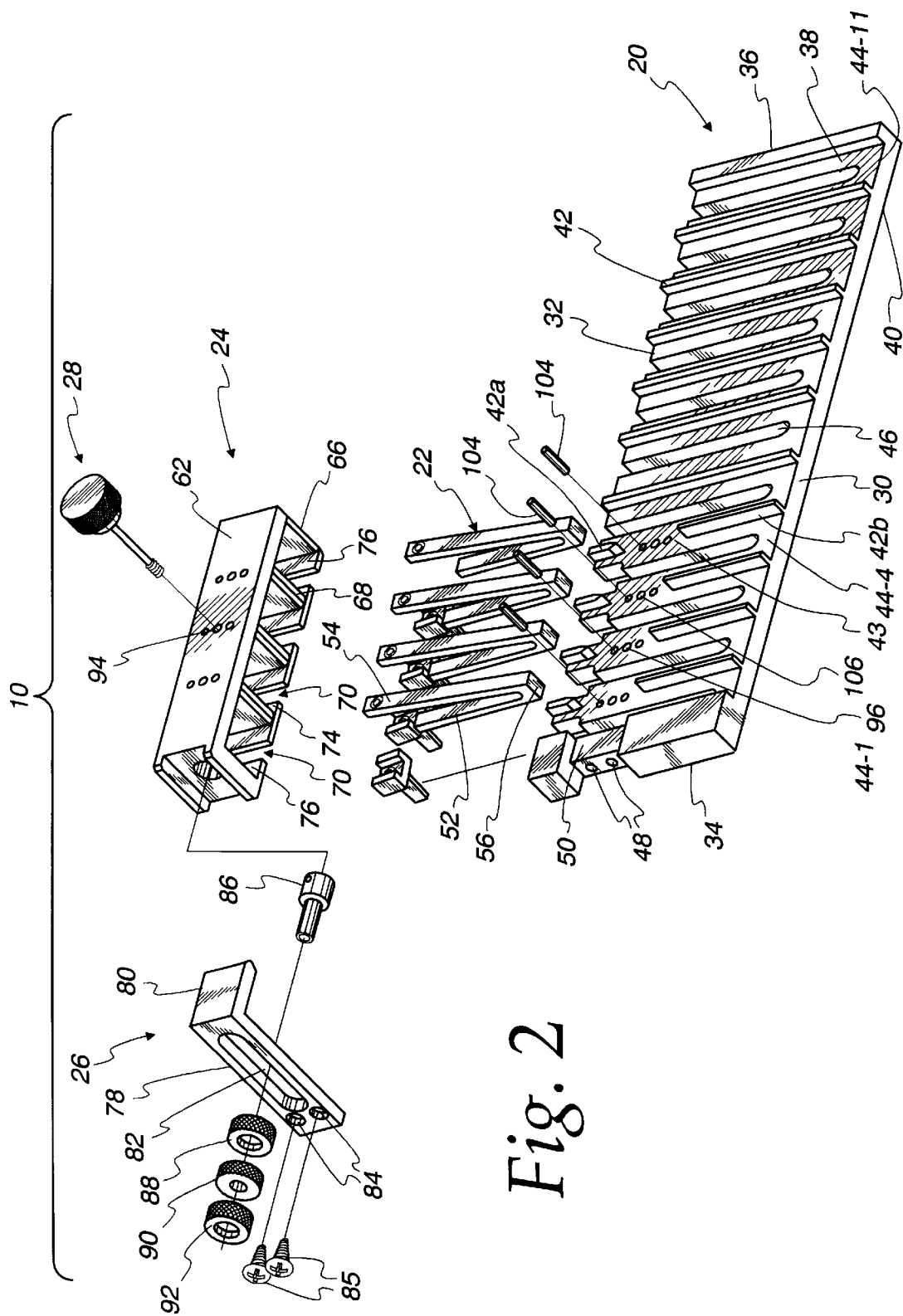
FIG. 2 is an exploded, perspective view of the tube holder assembly of FIG. 1.

Referring now in detail to the various views of the drawings, there is shown in FIGS. 1 and 2 a tube holder assembly of the present invention generally designated by reference numeral 10 which is especially designed to be integrated and mounted on an output track assembly 12 of a conventional test handler unit (not shown). The test handler unit may be of the type similar to Model No. 5050, which is manufactured and sold by Aetrium Company. The tube holder assembly 10 is of a unique configuration and is constructed in accordance with the principles of the present invention which is used for loading directly tested small outline integrated circuits (SOIC) packages into either empty plastic tubes or empty metal tubes from the output track assembly 12 of the test handler unit. As a result, there has been eliminated the extra or additional process step of transferring the SOIC packages from the plastic tubes to the metal tubes when there is required during the production procedure of a "burn-in" process.

Figure 11:
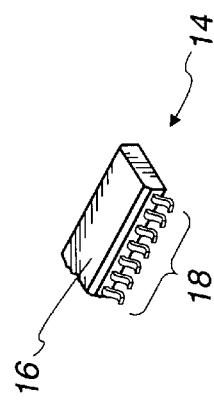
FIG. 11 is a perspective view of a SOIC package.

There is illustrated in FIG. 11 one of the plurality of conventional SOIC packages 14 of the dual-in-line (DIP) type which are to be loaded into the plastic or metal tubes. The SOIC package typically is of a substantially rectangularly-shaped configuration and includes a plastic body 16 having an IC encapsulated therein. A plurality of spaced-apart terminal leads 18 are arranged in two parallel rows on the opposed parallel sides of the body 16. The terminal leads 18 are partially housed inside of the body and are partially extended outwardly from the body. The distal ends of the terminal leads 18 are generally bent upwardly so as to form feet parallel to top and bottom surfaces of the body 16. In use, the SOIC packages are mounted on a printed circuit board (not shown) in desired positions thereon by soldering the distal ends of the leads 18 to corresponding pads on the surface of the printed circuit board. While the number of terminal leads 18 may vary from 8 to 48, there have been shown in this case only 7 terminal leads extending from each side of the body so as to total fourteen.

The tube holder assembly 10 is comprised of an output tube guide member 20, a plurality of tube sensor levers 22, a tube holder member 24, a tube holder guide member 26, and a holder screw 28. The output tube guide member 20 is formed of a substantially rectangularly-shaped base plate which includes opposed side walls 30 and 32, opposed end walls 34, 36, a top surface 38, and a bottom surface 40. The bottom surface 40 of the guide member 20 is adapted to be mounted to the top surface of the output track assembly 12 of the test handler unit. The top surface 38 of the guide member 20 is provided with a plurality of ribs 42 which are disposed in an equally-spaced apart relationship so as to define tracks 44-1 through 44-11 therebetween. Each of the ribs 42 extend upwardly a short distance from the top surface 38 of the guide member 20. In order to accommodate the loading or packing of eleven tubes, there are used ten ribs 42 for forming the eleven tracks for receiving separately therein a corresponding one of the tubes.

The output tube guide member 20 is of a single-piece construction and is preferably formed of a suitable metallic material such as aluminum or stainless steel. Further, the top surface 38 of the guide member 20 includes U-shaped troughs 46 each being sandwiched in an intermediate area between adjacent ribs 42. Each of the troughs extends horizontally from the opposed side wall 32 and terminates a short distance from the opposed side wall 30. Each of the first four troughs 46 has received therein a corresponding one of the tube sensor levers 22. Also, the opposed end wall 34 of the guide member 20 is formed with a pair of holes 48 which are positioned on the outer surface of a middle stepped-down portion 50 of the end wall 34.

Figure 7:
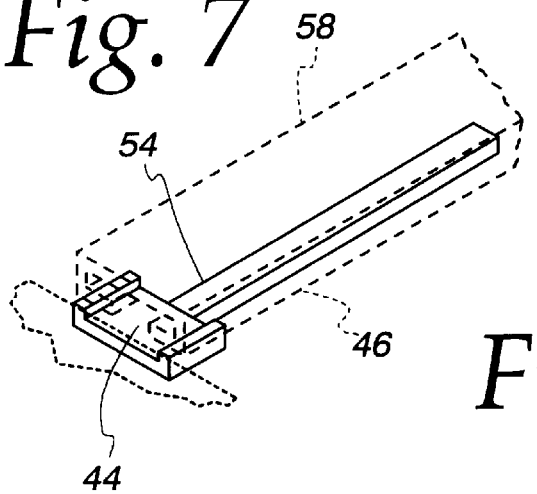
FIG. 7 is a fragmentary, perspective view of a plastic tube resting on the tube sensor.
Figure 8:
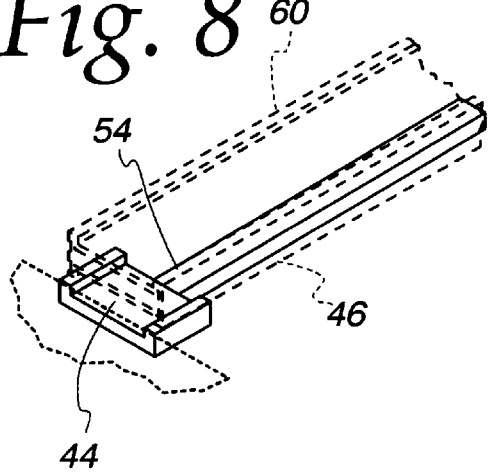
FIG. 8 is a fragmentary, perspective view of a metal tube resting on the tube sensor.
Figure 9:
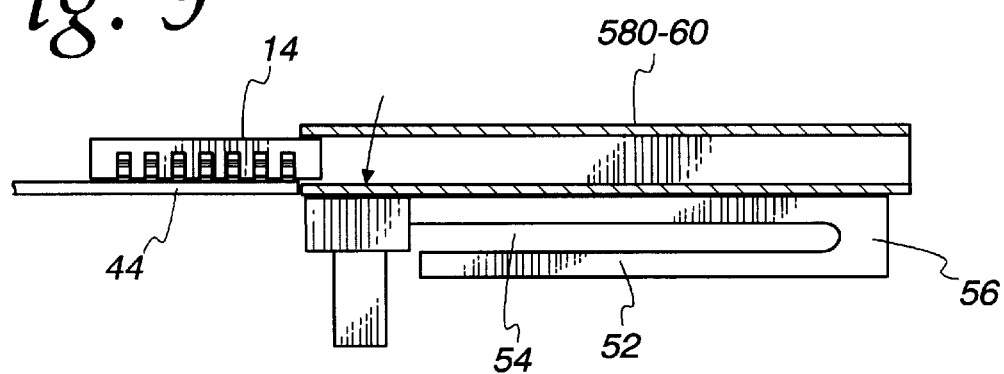
FIG. 9 is a side elevational view, showing a tube resting on the tube sensor.
Figure 10:
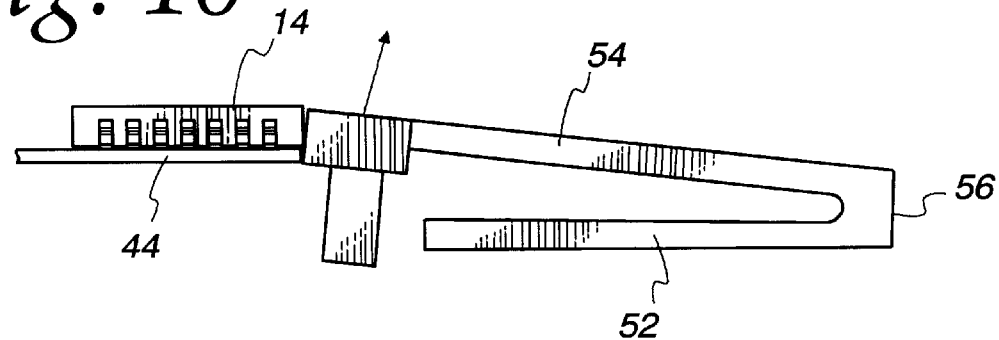
FIG. 10 is a side elevational view similar to FIG. 9, with no tube being placed on the tube sensor.

Each of the tube sensor levers 22 is formed of a substantially V-shaped configuration and includes a shorter leg portion 52 and a longer leg portion 54 cantilevered to the shorter leg portion 52 at a bight portion 56. As can best be seen from FIGS. 7–9 of the drawings, when a plastic tube 58 (FIG. 7) or a metal tube 60 (FIG. 8) is positioned securely on the top surface of a corresponding output track 44 the longer leg portion 54 of the sensor lever 22 will be depressed downwardly into the associated trough 46 so as to allow loading of the SOIC packages 14 into the respective tubes. As a consequence, a light beam (not shown) will be blocked so as to indicate to the test handler unit that a tube has been presently disposed on the surface of the output track 44. On the other hand, when no tube is placed on the top surface of the output track 44 the longer leg portion 54 of the sensor lever 22 will be extended upwardly beyond the top surface of the output track. This is illustrated in FIG. 10 of the drawings. Further, in this position the SOIC packages in the output track assembly 12 of the test handler unit will be unable to flow or pass into the output track 44. This is due to the fact that the distal end of the longer leg portion 54 of the sensor lever will be butting against the SOIC packages 14 so as to prevent them from falling into the output track 44.

It should be noted that only the first four output tracks 44-1 through 44-4 have mounted in their troughs the sensor levers 22 since it is only these tracks that can accommodate the loading of the SOIC packages 14 into either the plastic tubes 58 or the metal tubes 60. In addition, it will be apparent to those skilled in the art that the plastic tubes 58 are of a narrower width dimension than the metal tubes 60. In view of this, the tube holder member 24 is required to be used for holding the plastic tubes in the position within the associated output tracks 44 of the output tube guide member 20.

The tube holder member 24 is formed of a rectangularly-shaped housing consisting of a top wall 62 and opposed end walls 64, 66 joined to each end of the top wall 62. The housing has been especially designed so as to hold up to four (4) plastic tubes. Thus, there are provided three substantially equally spaced-apart narrow vertical struts 68 extending downwardly from the interior surface of the top wall 62 so as to form channels 70 therebetween. A thin, horizontal flange 72 is joined at its intermediate area to each of the corresponding struts 68 opposite the top wall 62 so as to form ledges 74. There are also provided ledges 76 extending inwardly from the opposed end walls 64 and 66. The end wall 64 is also formed with an aperture 77.

The tube holder guide member 26 is formed of a L-shaped bracket consisting of a vertical section 78 and a horizontal section 80 joined integrally to the vertical section 78. The vertical section 78 includes an elliptically-shaped slot 82 formed in its central portion and a pair of openings 84 formed adjacent its free end. The openings 84 are aligned with the holes 48 in the end wall 34 of the output tube guide member 20 so as to receive screws 85 therethrough for securely mounting the holder guide member 26 to the tube guide member 20. In order to adjustably mount the tube holder member 24 to hold the holder guide member 26, a set screw 86 is placed through the aperture 77 and the slot 82. Then, a flat washer 88 and a lock nut 90 are sequentially placed onto the free end of the set screw, and then a nut 92 is screwed onto the set screw 86. The holder guide member 26 functions as support means for holding the tube holder member 24 relative to the holder guide member 26 and as an adjustment means for allowing the tube holder member to slide vertically relative to the tube holder guide member 26 without requiring any adjustment to the nut 90.

In order to secure the tube holder member 24 to the output tube guide member 20, the holder screw 28 is placed through aligned openings 94 and 96 in the respective tube holder 24 and output tube guide member 20 and is then rotated so as to screw it into the internal threads of the opening 96. It will be noted that the horizontal portion 80 of the tube holder guide member 26 acts as a stop member for limiting the upward movement of the tube holder member 24 along the slot 82 when the top surface of the tube holder member 24 abuts the horizontal portion 80. It should also be understood that the tube holder member 24 and the tube holder guide member 26 may also be preferably formed of a suitable metallic material.

In use, in the situation where the manufacturing procedure requires the "burn-in" process to be performed on the tested SOIC packages 14 it will be necessary to load directly the tested SOIC packages into metal tubes 68 in lieu of the plastic tubes 58 from the output track assembly 12 of FIG. 1 of the test handler unit. Under this circumstance, an operator will be required initially to perform a simple conversion operation on the tube holder assembly 10 so as to accommodate the loading of the tested SOIC packages that must undergo the "burn-in" process. This conversion procedure will now be explained with reference to FIGS. 3 and 4.

Figure 3:
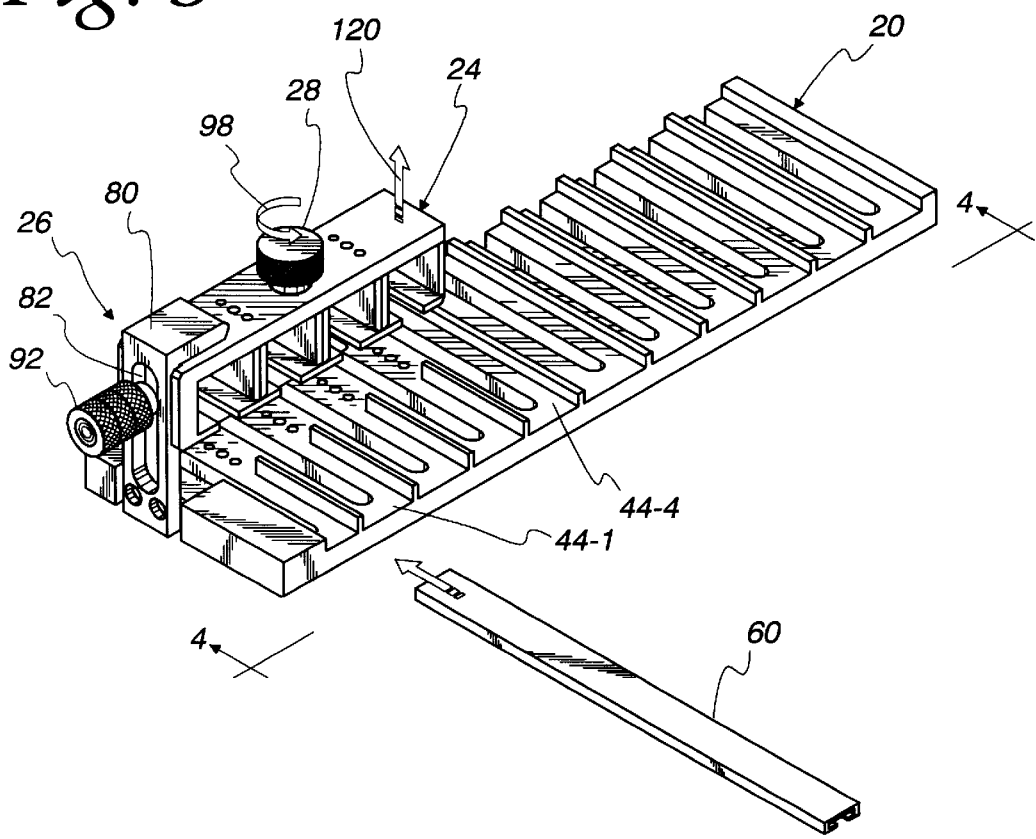
FIG. 3 is a view similar to FIG. 1, but with the output track assembly being removed.
Figure 4:
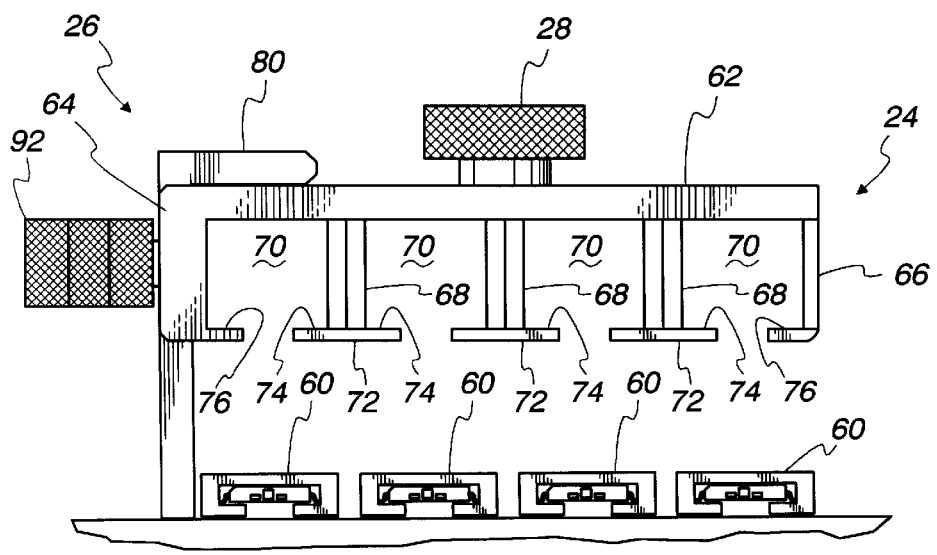
FIG. 4 is a front elevational view, taken along the lines 4—4 of FIG. 3 with the tube holder being in the upper position.

Firstly, the operator must rotate the holder screw 28 in a counter-clockwise direction as indicated by arrow 98 in FIG. 3 so as to release the tube holder 24 from the output tube guide member 20. Secondly, the tube holder member 24 is lifted in the direction of arrow 100 so as to slide upwardly the tube holder member 24 along the slot 82 of the tube holder guide member 24 until the top surface thereof comes to rest against the horizontal section 80 of the tube holder guide member 26. The tube holder member 24 will be held in the upper or raised position as depicted in FIG. 4 by the self-locking set screw 86 and the nut 92. Finally, the metal tubes 60 are inserted so as to be in contact engagement with the output tracks 44-1 to 44-4 of the output tube guide member 20, thereby allowing loading of the tested SOIC packages 14 from the output track assembly 12.

Figure 5:
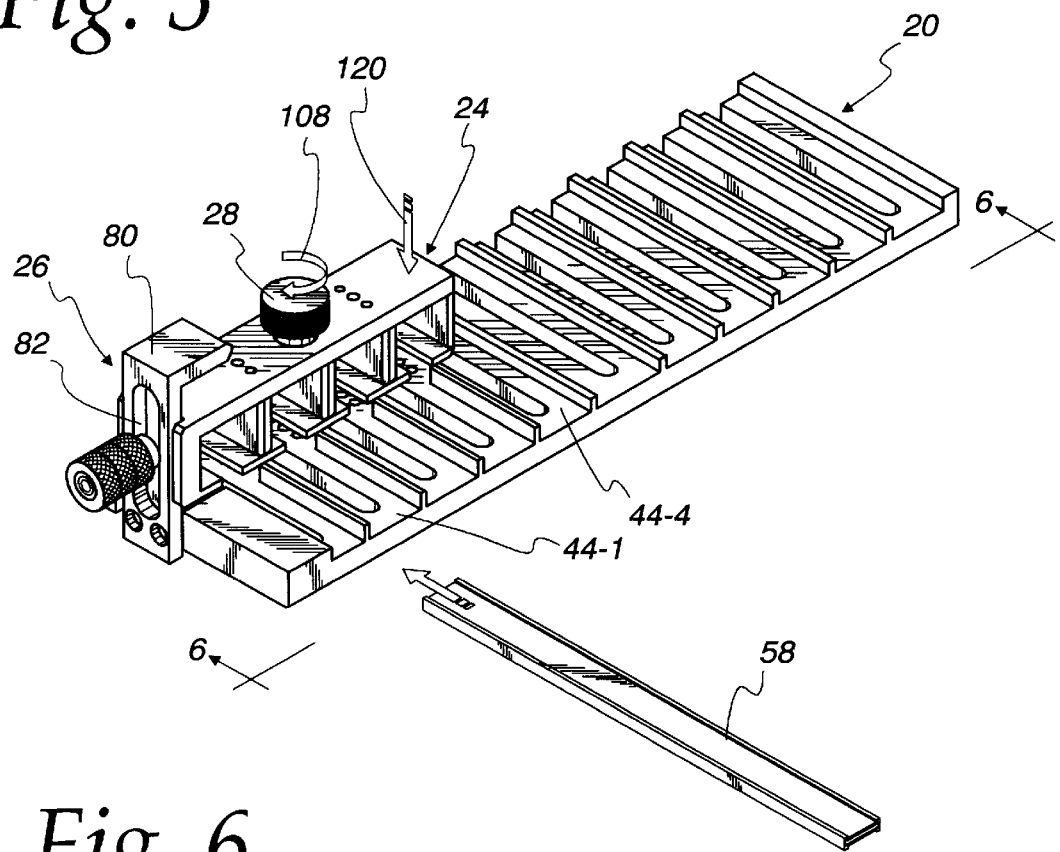
FIG. 5 is a view similar to FIG. 3, but for use with a plastic tube.
Figure 6:
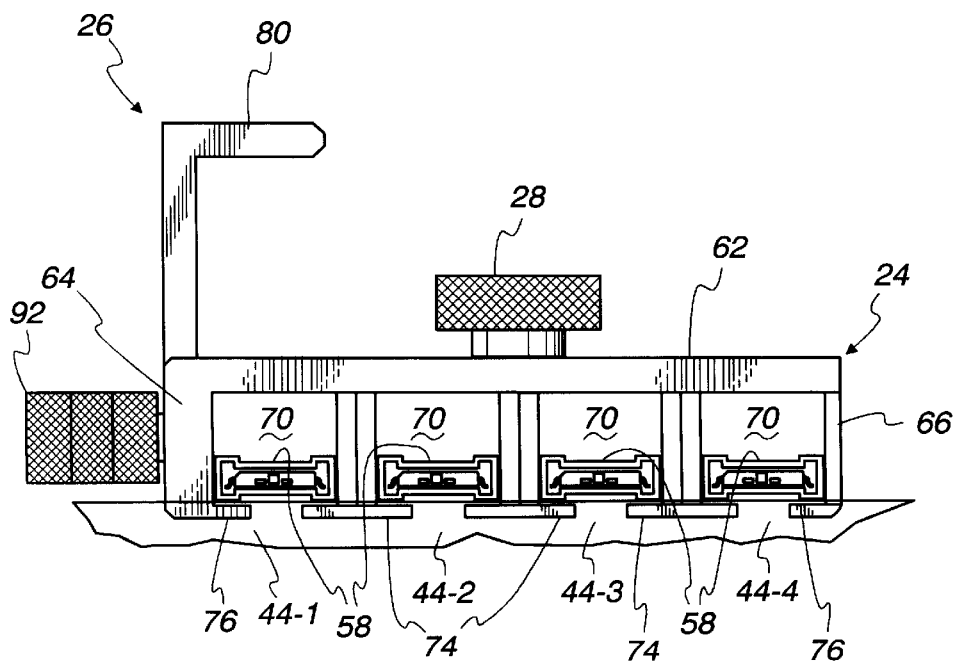
FIG. 6 is a front elevational view, taken along the lines 6—6 of FIG. 5, with the tube holder being in the lower position.

Alternatively, in the situation where the manufacturing process has determined that the "burn-in" process is not required to be performed on the tested SOIC packages, it will be necessary to load directly the tested SOIC packages into the plastic tubes 58. Assuming that the tube holder member 24 is in the raised position of FIG. 4, the operator will be required to perform a simple conversion procedure on the tube holder assembly 10 similar to the one just described with respect to FIGS. 3 and 4 so as to accommodate the loading directly of the tested SOIC packages into the plastic tubes. This conversion process will now be described in connection with FIGS. 5 and 6. At the outset, the operator must push down on the tube holder member 24 in the direction of arrow 102 so as to cause the same to slide downwardly along the slot 82 of the tube holder guide member 26 until the ledges 74, 76 come to rest against the top surface of the output tracks 44-1 through 44-4, as shown in FIG. 6.

It will be observed that each of the ribs 42-1 through 42-4 (FIG. 2) are actually formed of a short segment 42a and a longer segment 42b spaced apart from the short segment so as to form a gap 43 so as to accommodate the length dimension of the struts 68. Withing the gap 43, there are provided alignment pins 104 mounted in holes 106 so as to assist in aligning the tube holder member 24 to the top surface of the output tracks 44-1 through 44-4 in the output tube guide member 20. Next, the holder screw 28 is rotated in the clockwise direction of arrow 108 in FIG. 5 so as to secure tightly the tube holder member 24 to the output tube guide member 20. As a result, the tube holder member 24 will be secured in the lower position as depicted in FIG. 6. Finally, the plastic tubes 58 are inserted so as to be in contact engagement with the ledges 74, 76 of the tube holder member 24, thereby allowing loading of the tested SOIC packages from the output track assembly 12.

From the foregoing detailed description, it can thus be seen that the present invention provides an apparatus for use with an output track assembly of an IC test handler so as to eliminate the transferring of tested SOIC packages from plastic tubes to metal tubes for a "burn-in" process. This is achieved by a tube holder guide member which is vertically slidable for directly transferring SOIC packages into either plastic tubes when placed in a lower position or metal tubes when placed in an upper position.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A tube holder assembly for use with an output track assembly of an IC test handler, said tube holder assembly comprising:

an output tube guide member operatively connected to said output track assembly of the IC test handler;

said output tube guide member having a plurality of output tracks and being adapted to receive ones of plastic tubes and metal tubes;

a tube holder member;

a tube holder guide member operatively connected to said output tube guide member to support said tube holder member, said tube holder member being vertically slidable relative to said tube holder guide member between a lower position and an upper position;

said tube holder member being pushed downwardly into said lower position so as to load directly SOIC packages into said plastic tubes and being raised to said upper position so as to load directly the SOIC packages into said metal tubes; and means for releasably securing said tube holder member in said lower position so as to hold said tube holder member in a position within said plurality of output tracks of said output tube guide member when the SOIC packages are being loaded into said plastic tubes.

2. A tube holder assembly as claimed in claim 1, further comprising tube sensor levers disposed in corresponding ones of said plurality of output tracks on said output tube guide member for detecting the presence of either said plastic tubes or said metal tubes being positioned in said corresponding ones of said plurality of output tracks.

3. A tube holder assembly as claimed in claim 2, wherein each of said tube sensor levers is formed of a substantially V-shaped configuration and includes a shorter leg portion and a longer leg portion cantilevered to said shorter leg portion at a bight portion.

4. A tube holder assembly as claimed in claim 3, wherein said output tube guide member is formed of a substantially rectangularly-shaped base plate which includes opposed side walls, opposed end walls, a top surface, and a bottom surface.

5. A tube holder assembly as claimed in claim 4, wherein said top surface is formed with a plurality of ribs which are disposed in an equally spaced-apart relationship so as to define said plurality of output tracks and is further formed with U-shaped troughs each being disposed in an intermediate area between adjacent ones of said plurality of ribs so as to receive said tube sensor levers.

6. A tube holder assembly as claimed in claim 5, wherein said output tube guide member is formed of a single-piece construction.

7. A tube holder assembly as claimed in claim 6, wherein said output tube guide member is formed of a metallic material.

8. A tube holder assembly as claimed in claim 1, wherein said tube holder member is formed of a rectangularly-shaped housing consisting of a top wall, and opposed end walls joined to ends of said top wall.

9. A tube holder assembly as claimed in claim 8, further comprising narrow, vertical struts extending downwardly from the interior surface of said top wall so as to form channels therebetween so as to hold said plastic tubes, and horizontal flanges joined to ends of said struts opposite said top wall so as to form ledges.

10. A tube holder assembly as claimed in claim 9, wherein said tube holder guide member is formed of a L-shaped bracket consisting of a vertical section and a horizontal section, said vertical section including an elliptically-shaped slot formed in its central portion to permit said tube holder member to slide vertically between said lower position and said upper position.

11. A tube holder assembly for use with an output track assembly of an IC test handler, said tube holder assembly comprising:

output tube guide means operatively connected to said output track assembly of the IC test handler;

said output tube guide means having a plurality of output tracks and being adapted to receive ones of plastic tubes and metal tubes;

tube holder means;

tube holder guide means operatively connected to said output tube guide means for supporting said tube holder means, said tube holder means being vertically slidable relative to said tube holder guide means between a lower position and an upper position;

said tube holder means being pushed downwardly into said lower position so as to load directly SOIC packages into said plastic tubes and being raised to said upper position so as to load directly the SOIC packages into said metal tubes; and means for releasably securing said tube holder means in said lower position so as to hold said tube holder means in a position within said plurality of output tracks of said output tube guide means when the SOIC packages are being loaded into said plastic tubes.

12. A tube holder assembly as claimed in claim 11, further comprising tube sensor means disposed in corresponding ones of said plurality of output tracks on said output tube guide means for detecting the presence of either said plastic tubes or said metal tubes being positioned in said corresponding ones of said plurality of output tracks.

13. A tube holder assembly as claimed in claim 12, wherein each of said tube sensor means is formed of a substantially V-shaped configuration and includes a shorter leg portion and a longer leg portion cantilevered to said shorter leg portion at a bight portion.

14. A tube holder assembly as claimed in claim 13, wherein said output tube guide means is formed of a substantially rectangularly-shaped base plate which includes opposed side walls, opposed end walls, a top surface, and a bottom surface.

15. A tube holder assembly as claimed in claim 14, wherein said top surface is formed with a plurality of ribs which are disposed in an equally spaced-apart relationship so as to define said plurality of output tracks and is further formed with U-shaped troughs each being disposed in an intermediate area between adjacent ones of said plurality of ribs so as to receive said tube sensor means.

16. A tube holder assembly as claimed in claim 11, wherein said tube holder means is formed of a rectangularly-shaped housing consisting of a top wall, and opposed end walls adjoined to ends of said top wall.

17. A tube holder assembly as claimed in claim 16, further comprising narrow, vertical struts extending downwardly from the interior surface of said top wall so as to form channels therebetween so as to hold said plastic tubes, and horizontal flanges joined to ends of said struts opposite said top wall so as to form ledges.

18. A tube holder assembly as claimed in claim 17, wherein said tube holder guide means is formed of a L-shaped bracket consisting of a vertical section and a horizontal section, said vertical section including an elliptically-shaped slot formed in its central portion to permit said tube holder means to slide vertically between said lower position and said upper position.

* * * * *